(12) United States Patent
Chiu et al.

(10) Patent No.: US 11,812,564 B2
(45) Date of Patent: Nov. 7, 2023

(54) ELECTRONIC DEVICE

(71) Applicants: Yujun Chiu, Tainan (TW); Joe Huang, Chiayi County (TW)

(72) Inventors: Yujun Chiu, Tainan (TW); Joe Huang, Chiayi County (TW)

(73) Assignee: Innolux Corporation, Miao-Li County (TW)

( * ) Notice: Subject to any disclaimer, the term of this patent is extended or adjusted under 35 U.S.C. 154(b) by 598 days.

(21) Appl. No.: 16/935,471

(22) Filed: Jul. 22, 2020

(65) Prior Publication Data
US 2022/0030725 A1 Jan. 27, 2022

(51) Int. Cl.
*H05K 5/00* (2006.01)
*H05K 5/02* (2006.01)
*G01N 35/00* (2006.01)
*H04B 7/0456* (2017.01)
*G02F 1/1333* (2006.01)

(52) U.S. Cl.
CPC .......... *H05K 5/0013* (2013.01); *G01N 35/00* (2013.01); *G02F 1/133308* (2013.01); *H04B 7/046* (2013.01); *H05K 5/0217* (2013.01)

(58) Field of Classification Search
CPC ......... G02F 1/133317; G02F 1/133322; G02F 1/133328; G02F 1/133308
See application file for complete search history.

(56) References Cited

U.S. PATENT DOCUMENTS

| | | |
|---|---|---|
| 2005/0151895 A1 | 7/2005 | Fukuyoshi et al. |
| 2007/0115207 A1 | 5/2007 | Jang et al. |
| 2008/0137272 A1 | 6/2008 | Cheng et al. |
| 2012/0327633 A1* | 12/2012 | Jang ................. G02F 1/133308 362/97.1 |
| 2015/0301563 A1 | 10/2015 | Mathew et al. |
| 2016/0216729 A1* | 7/2016 | Ohtomo ............ G02F 1/133308 |
| 2016/0270244 A1* | 9/2016 | Ohtomo ............... H05K 5/0017 |

* cited by examiner

*Primary Examiner* — Jia X Pan
(74) *Attorney, Agent, or Firm* — Patterson + Sheridan, LLP

(57) ABSTRACT

An electronic device is provided. The electronic device includes: a panel, a first support component, and a second support component. The panel includes a bottom surface, a first corner and a second corner, and the bottom surface is connected between the first corner and the second corner. The first support component includes a first side portion that supports the first corner of the panel. The first side portion has a first length and a first Young's modulus. The second support component includes a second side portion that supports the second corner of the panel. The second side portion has a second length and a second Young's modulus. The first length and the second length satisfy the following inequalities:

$$10 \times \sqrt{\frac{W}{2k1 \times \tan 1°}} \le L1 < \frac{P}{2}, \text{ and}$$

$$10 \times \sqrt{\frac{W}{2k2 \times \tan 1°}} \le L2 < \frac{P}{2}, \ldots$$

18 Claims, 7 Drawing Sheets

ELECTRONIC DEVICE

BACKGROUND

Field of the Disclosure

The present disclosure relates to an electronic device, and in particular to an electronic device having a plurality of support components.

Description of the Related Art

Traditionally, the housing of an electronic device is made of a hard and inelastic plastic material, so it is necessary to arrange an additional spacer and leave a gap between the display panel and the housing. However, this makes it difficult to reduce the size of the electronic device and complicates the assembly process. In addition, if the electronic device has an upright configuration, support for the electronic panel needs to be taken into consideration to maintain a high-quality display. Therefore, finding a way to solve the above problems has become an important issue.

BRIEF SUMMARY

Some embodiments of the disclosure provide an electronic device, including: a panel, a first support component, and a second support component. The panel includes a bottom surface, a first corner and a second corner, and the bottom surface is connected between the first corner and the second corner. The first support component includes a first side portion that supports the first corner of the panel. The first side portion has a first length and a first Young's modulus. The second support component includes a second side portion that supports the second corner of the panel. The second side portion has a second length and a second Young's modulus. The first length and the second length satisfy the following inequalities:

$$10 \times \sqrt{\frac{W}{2k1 \times \tan 1°}} \leq L1 < \frac{P}{2}, \text{ and}$$

$$10 \times \sqrt{\frac{W}{2k2 \times \tan 1°}} \leq L2 < \frac{P}{2},$$

wherein W is the weight (N) of the panel, and P is the length (mm) of the panel, L1 is the first length (mm), k1 is the first Young's modulus (MPa), L2 is the second length (mm), k2 is the second Young's modulus (MPa), and each of k1 and k2 is in a range from 500 to 2500.

For making the above or other purposes, features and advantages of the present disclosure more clear, some embodiments are provided in the following paragraphs, and subsequent detailed description is provided as follows with reference to the accompanying drawings.

BRIEF DESCRIPTION OF THE DRAWINGS

The present disclosure can be more fully understood by reading the subsequent detailed description and examples with references made to the accompanying drawings, wherein.

DETAILED DESCRIPTION

Figure 1:
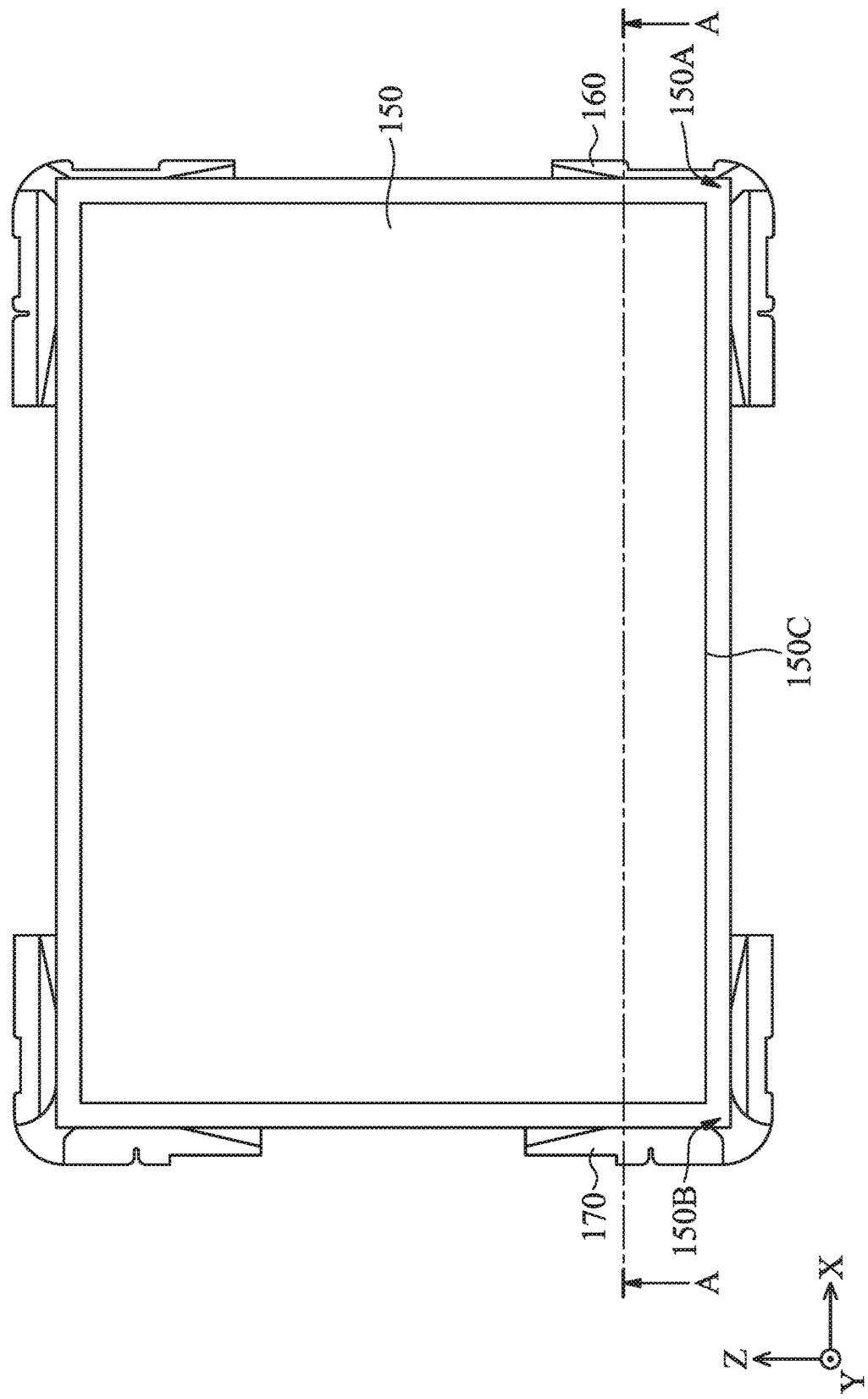
FIG. 1 is a top view illustrating an electronic device in accordance with some embodiments of the present disclosure.

The electronic devices of some embodiments of the present disclosure are described in the following description. The specific embodiments disclosed are provided merely to clearly describe the usage of the present disclosure by some specific methods without limiting the scope of the present disclosure.

The present disclosure can be understood by referring to the following detailed description and the accompanying drawings. It should be noted that, in order to make the drawings simple and easy to understand, the multiple drawings in the present disclosure may merely illustrate a portion of the electronic device, and certain elements in the drawings are not drawn to scale. In addition, the number and size of each element in the figures are merely for illustration, and are not intended to limit the scope of the present disclosure.

Certain terms may be used throughout the present disclosure and the appended claims to refer to particular elements. Those skilled in the art will understand that electronic device manufacturers may refer to the same components under different names. The present specification is not intended to distinguish between components that have the same function but different names. In the following specification and claims, the words "including", "containing", "having" and the like are open words, so they should be interpreted as meaning "including but not limited to . . . " Therefore, when the terms "including", "containing" and/or "having" are used in the description of the present disclosure, they specify the existence of corresponding features, regions, steps, operations, and/or components, but do not exclude one or more existence of a corresponding feature, region, step, operation, and/or component.

In addition, in this specification, relative expressions may be used. For example, "lower", "bottom", "higher" or "top" are used to describe the position of one element relative to another. It should be noted that if a device is flipped upside down, an element that is "lower" will become an element that is "higher."

When a corresponding component (such as a film layer or region) is referred to as "on another component", it may be directly on another component, or there may be other components in between. On the other hand, when a component is called "directly on another component", there is no component between the former two. In addition, when a component is called "on another component", the two components have an up-down relationship in the top view, and this component can be above or below the other component, and this up-down relationship depends on the orientation of the device.

The terms "about", "equal to", "equal" or "identical", "substantially" or "approximately" are generally interpreted as within 20% of a given value or range, or as interpreted as within 10%, 5%, 3%, 2%, 1%, or 0.5% of a given value or range.

It should be understood that, although the terms "first", "second," etc. may be used herein to describe various elements, regions, layers and/or portions, and these elements, regions, layers, and/or portions should not be limited by these terms. These terms are only used to distinguish one element, component, region, layer, or portion. Thus, a first element, component, region, layer or portion discussed below could be termed a second element, component, region, layer or portion without departing from the teachings of some embodiments of the present disclosure.

Unless defined otherwise, all terms (including technical and scientific terms) used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined in the present disclosure. In addition, the term "substrate" in the following paragraphs may include elements formed on the substrate or various layers covering the substrate, such as any active component (e.g. transistor) that is formed thereon as required. However, in order to simplify the figures herein, it is shown as a plane substrate.

FIG. 1 is a top view illustrating an electronic device 100 in accordance with some embodiments of the present disclosure. It should be noted that the electronic device 100 may include a display device, an antenna device (such as a liquid-crystal antenna), a sensing device, or a tiled device, but is not limited thereto. The electronic device may include a bendable or flexible electronic device. The electronic device may include liquid-crystal, a light-emitting diode, an organic light-emitting diode (OLED), a mini LED, a micro LED or quantum dot (QD) light-emitting diode (which may be referred to as QLED, QDLED), fluorescence, phosphor, other suitable material or a combination thereof, but is not limited thereto. The antenna device may be a liquid crystal, but it is not limited thereto. The tiled device may be a display tiled device or an antenna tiled device, but it is not limited thereto. It should be noted that the electronic device may be an arbitrary combination thereof, but it is not limited thereto. The present disclosure is described in a manner that a display device serves as the electronic device or the tiled device as follows, but the present disclosure is not limited thereto.

As shown in FIG. 1, the display device 100 includes a panel 150. For example, the panel 150 may be a display panel. As shown in FIG. 1, the panel 150 is rectangular, but it is not limited thereto. In the present embodiment, the panel 150 has a first corner 150A, a second corner 150B, and a bottom surface 150C, wherein the bottom surface 150C connects the first corner 150A and the second corner 150B. The electronic device 100 further includes a first support component 160 and a second support component 170, each of which corresponds to the first corner 150A and the second corner 150B of the panel 150, respectively. In some embodiments, the electronic device 100 is in an upright configuration. When users look at the panel 150, the first corner 150A, the second corner 150B, and the bottom surface 150C are located below (i.e. the lower part). At this time, the first support component 160 supports the first corner 150A of the panel 150, and the second support component 170 supports the second corner 150B of the panel 150. In some embodiments, the electronic device 100 may be provided with at least two support components, each corresponding to the corners of the panel 150, but is not limited thereto. The Young's modulus of the first support component 160 and the Young's modulus of the second support component 170 are in a range from 500 MPa to 2500 MPa (500 MPa Young's modulus 2500 MPa), such as 750 MPa, 900 MPa, 1000 MPa, 1100 MPa, 1250 MPa, 1500 MPa, 1750 MPa, 2000 MPa, 2250 MPa, etc., but not limited to the values listed above. For example, the materials of the first support component 160 and the second support component 170 may include thermoplastic vulcanizate (TPV), thermoplastic elastomer (TPE), etc., but not limited thereto.

Figure 2:
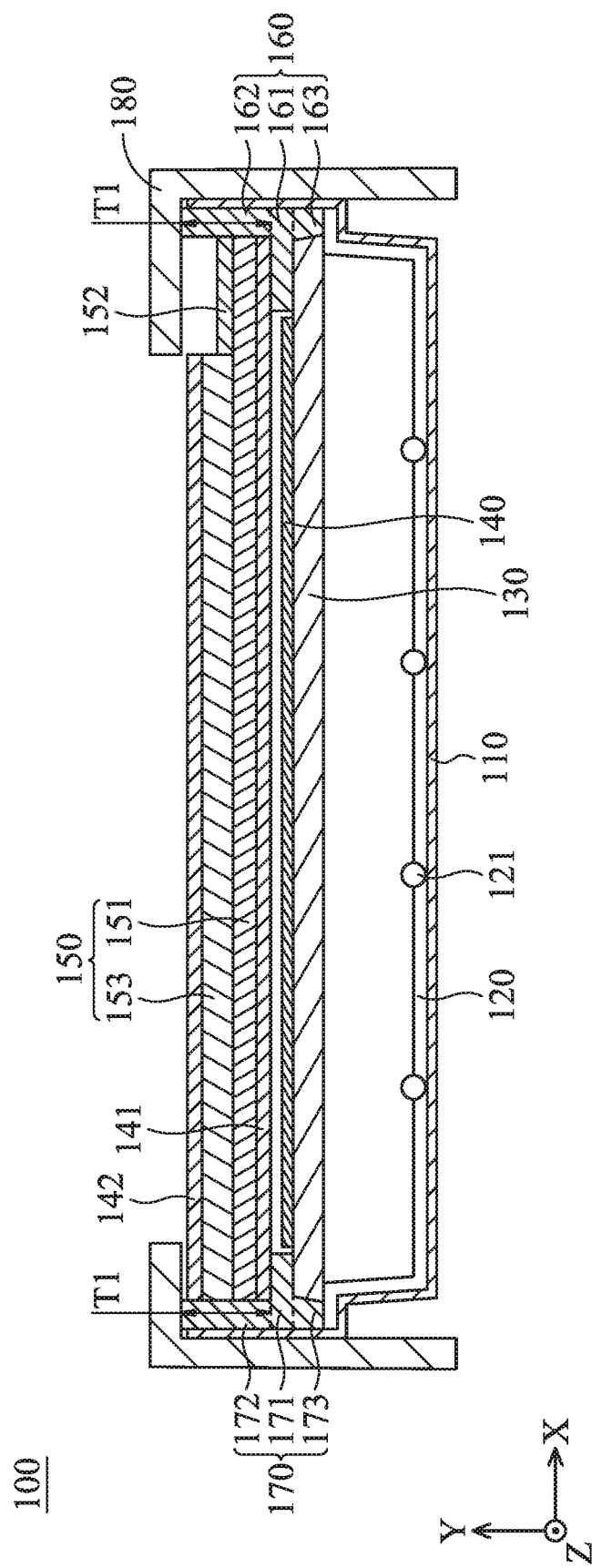
FIG. 2 is a cross-sectional view along line A-A shown in FIG. 1.

Please refer to FIG. 2, which illustrates a cross-sectional view along line A-A shown in FIG. 1. In the present embodiment, the electronic device 100 may include a backlight module, but it is not limited thereto. As shown in FIG. 2, the electronic device 100 includes a back plate 110. In some embodiments, the back plate 110 may include metal, plastic, other suitable materials, or a combination thereof, but is not limited thereto. The back plate 110 may have a certain structural strength for supporting the electronic device 100. A reflective sheet 120 and a light-emitting element 121 are disposed on the back plate 110, wherein the light-emitting element 121 is disposed on the reflective sheet 120, so that the light emitted by the light-emitting element 121 may be reflected by the reflective sheet 120 to the panel 150 of the electronic device 100, achieving the effect of display.

In the present embodiment, the first support component 160 includes a main portion 161, a side portion 162, and a support portion 163, wherein the main portion 161 extends in a direction (e.g. X-Y plane) that is substantially parallel to the panel 150, the side portion 162 and the support portion 163 protrude from the main portion 161, and are located on opposite sides of the main portion 161, respectively. Similarly, the second support component 170 includes a main portion 171, a side portion 172, and a support portion 173, wherein the main portion 171 extends in a direction that is substantially parallel to the panel 150, the side portion 172 and the support portion 173 protrude from the main portion 171, and are located on opposite sides of the main portion 171. In the present embodiment, the reflective sheet 120 extends below the first support component 160 and the second support component 170, and the support portion 163 and the support portion 173 contact the reflective sheet 120.

A diffusion plate 130 is disposed on the reflective sheet 120 and the light-emitting element 121 to diffuse the light from the light-emitting element 121. In the present embodiment, in a cross-sectional view, the diffusion plate 130 may be disposed between the support portion 163 and the support portion 173. In some embodiments, the diffusion plate 130 may contact the lower surfaces of the main portion 161 and the main portion 171 (i.e. the surfaces facing the light-emitting element 121), but it is not limited thereto. An optical film 140 is disposed on the diffusion plate 130 to perform appropriate optical treatment on the light passing through the diffusion plate 130. In the present embodiment, in a cross-sectional view, the optical film 140 may be located between the main portion 161 and the main portion 171. The thickness of the optical film 140 may be smaller than the thickness of the main portion 161, and/or smaller than the thickness of the main portion 171, but it is not limited thereto. In some embodiments, the thickness of the optical film 140 may be substantially equal to the thickness of the main portion 161 and/or the thickness of the main portion 171. The above thicknesses of the optical film 140, the main portion 161, and the main portion 171 are measured in the Y direction.

The panel 150 is disposed on the optical film 140. In an embodiment, the panel 150 may be a liquid crystal display panel, but it is not limited thereto. For example, the panel 150 may include a first substrate 151, a second substrate 153 and a liquid crystal layer (not shown). The second substrate 153 may be disposed on the first substrate 151. The liquid crystal layer may be disposed between the first substrate 151 and the second substrate 153. The panel 150 may include a driving circuit layer (not shown), a filter layer (not shown), a light-shielding layer (not shown), and/or any other suitable element disposed between the first substrate 151 and the second substrate 153. Moreover, the first substrate 151 may further include flexible printed circuit (FPC) or chip on film (COF), but not limited thereto. In the present embodiment, a conductive pad 152 may be disposed on one side (such as the right side of FIG. 2, but not limited thereto) of the first substrate 151, wherein the conductive pad 152 may be configured to electrically connect the panel 150 to an external circuit (such as a control circuit). In some embodiments, the conductive pad 152 may be disposed on the bottom surface 150C of the panel 150 (as shown in FIG. 1), but it is not limited thereto.

In the present embodiment, the first support component 160 may be disposed on one side that is close to the conductive pad 152, and the second support component 170 is disposed on another side that is away from the conductive pad 152. In some embodiments, the panel 150 may be disposed on the main portion 161 of the first support component 160 and the main portion 171 of the second support component 170, and contact the side portion 162 of the first support component 160 and the side portion 172 of the second support component 170. Since the first support component 160 and the second support component 170 have an appropriate range of Young's modulus, the damage to the panel 150 may be reduced, or cushion may be provided for the panel 150.

In addition, a lower polarizer sheet 141 may be disposed below the panel 150, and an upper polarizer sheet 142 may be disposed on the panel 150, but the present disclosure is not limited thereto. For example, at least one of the lower polarizer sheet 141 and the upper polarizer sheet 142 may be omitted. In the present embodiment, the lower polarizer sheet 141 and the upper polarizer sheet 142 may be both disposed on the main portion 161 and the main portion 171, when viewed in a top view (such as on the Y axis), the at least a portion of lower polarizer sheet 141 overlap with the main portion 161 and the main portion 171 and at least a portion of the upper polarizer sheet 142 overlap with the main portion 161 and the main portion 171. In some embodiments, those skilled in the art may adjust the configuration or number of the lower polarizer sheet 141 or the upper polarizer sheet 142 as required. In other words, the lower polarizer sheet 141 or the upper polarizer sheet 142 may be selectively disposed, or a plurality of lower polarizer sheets 141 or a plurality of upper polarizer sheets 142 may be disposed. In some embodiments, the thickness T1 of the side portion 162 (and the side portion 172) may be substantially equal to the total thickness of the panel 150, the lower polarizer sheet 141, and the upper polarizer sheet 142. More specifically, the ratio of the thickness of the side portion 162 (and side portion 172) to the total thickness of the panel 150, the lower polarizer sheet 141, and the upper polarizer sheet 142 may be in a range from 90% to 110% (90%≤thickness ratio≤110%), such as 95%, 100% (that is, the former two are equal), 105%, etc., but it is not limited to the values listed above. The above configuration may reduce the probability of generating defects such as light leakage in the electronic device 100.

In addition, a housing 180 may be selectively disposed to protect components inside the electronic device 100. In the present embodiment, the housing 180 is disposed on the first support component 160, the second support component 170 and the back plate 110, and the housing 180 may extend to the outside of the back plate 110. For example, the material of the housing 180 may include metal, plastic, other suitable materials, or a combination thereof, but is not limited thereto.

Figure 3:
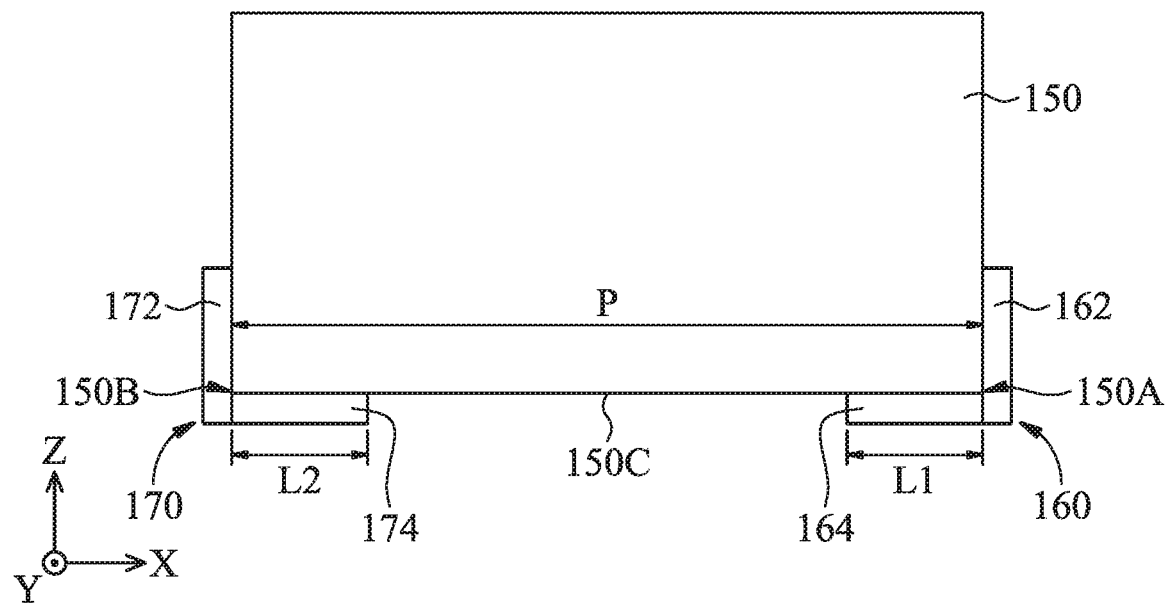
FIG. 3 is a schematic view illustrating the electronic device in accordance with some embodiments of the present disclosure.

FIG. 3 is a schematic view illustrating the electronic device 100 in accordance with some embodiments of the present disclosure. As shown in FIG. 3, the first support component 160 further includes a first side portion 164, which supports the first corner 150A of the panel 150, wherein the first side portion 164 has a first length L1. Similarly, the second support component 170 further includes a second side portion 174, which supports the second corner 150B of the panel 150, wherein the second side portion 174 has a second length L2. In an embodiment, the first length L1 may be the maximum length of the first side portion 164, and the second length L2 may be the maximum length of the second side portion 174, but they are not limited thereto. In addition, the panel has a length P. The lengths of the panel 150, the first side portion 164, and the second side portion 174 are measured in the X direction, for example. Since the first side portion 164 and the second side portion 174 are separate from each other, the upper limit of the first length L1 and the upper limit of second length L2 may be smaller than a half of the length P (L1<P/2 and L2<P/2). If the first length L1 (or the second length L2) is too long, a part of the first side portion 164 (or the second side portion 174) that is close to the center of the bottom surface 150C, but the first side portion 164 (or the second side portion 174) may sag, so that the mura of the panel 150 may be affected. In some embodiments, the first length L1 may be smaller than a quarter of the length P and the second length L2 may be smaller than a quarter of the length P, but they are not limited thereto.

Figure 4:
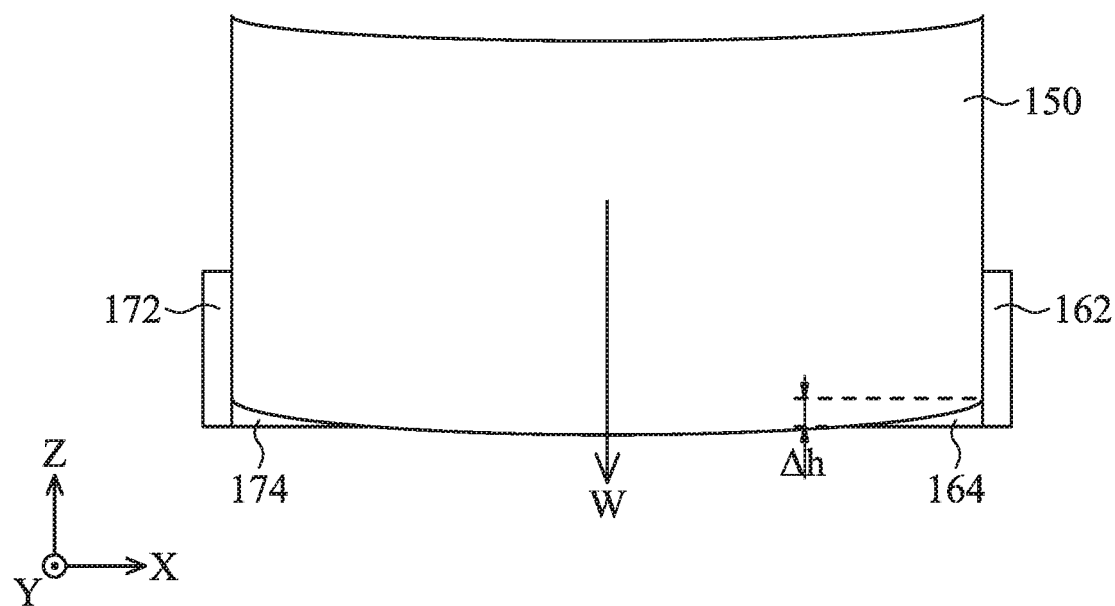
FIG. 4 is a schematic view illustrating the electronic device in accordance with some embodiments of the present disclosure.
Figure 5:
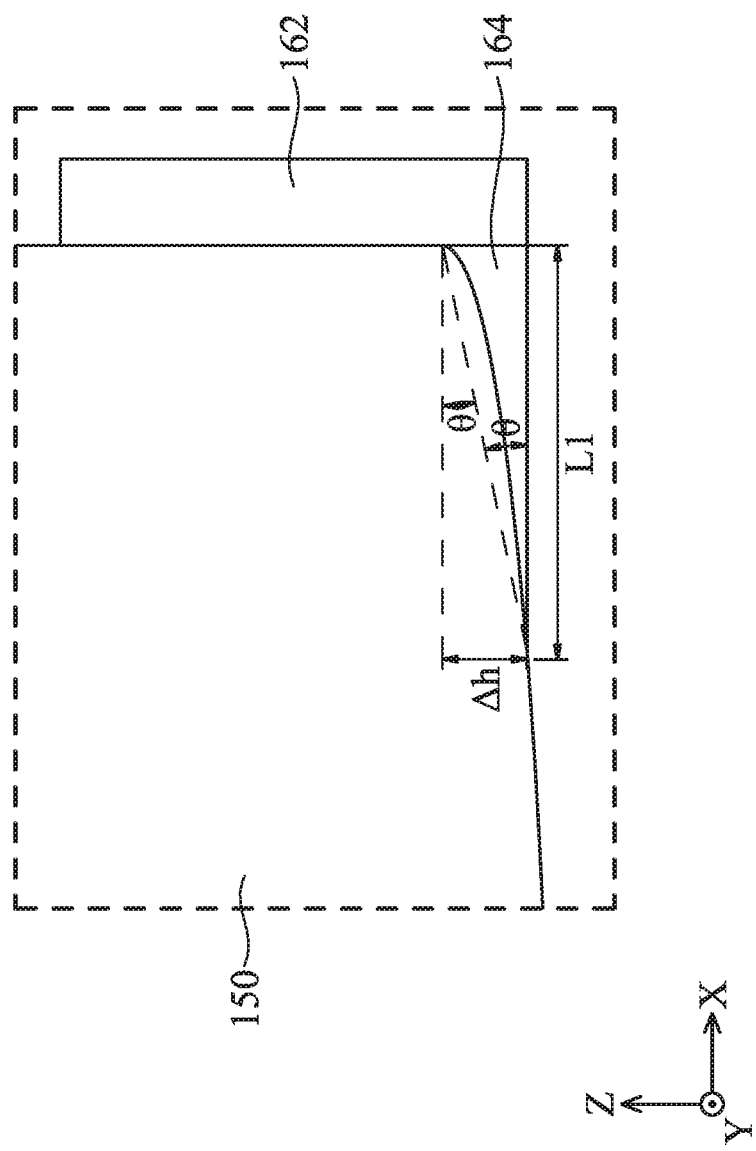
FIG. 5 is a partial enlarged view illustrating the electronic device in accordance with some embodiments of the present disclosure.

FIG. 4 is a schematic view illustrating the electronic device 100 in accordance with some embodiments of the present disclosure, and FIG. 5 is a partial enlarged view illustrating the electronic device 100 in accordance with some embodiments of the present disclosure. As shown in FIGS. 4 and 5, since the panel 150 has a weight W itself, it would press the first side portion 164 and the second side portion 174, so that the first side portion 164 and the second side portion 174 may have a deformation length $\Delta h$ (which is calculated by the thickness of the first side portion 164 and the second side portion 174 in the Z direction). For example, an imaginary triangle may be drawn based on the first length L1 and the deformation length $\Delta h$ of the first side portion 164, and a deformation angle $\theta$ is formed between the first length L1 and the deformation length $\Delta h$ (shown in FIG. 5). In general, if the deformation angle $\theta$ is greater than 1 degree, users may notice that the panel 150 has been deformed with the naked eye, which affects the visual experience. Therefore, in order to reduce the possibility that the user notices the panel 150 has been deformed, the deformation angle θ must be less than or equal to 1 degree.

According to the generalized Hooke's law, the stress generated by the weight of the panel 150 may be substantially equal to the Young's modulus of the first side portion 164 (or the second side portion 174) times the deformation length Δh. In this way, the critical values of the first length L1 and the second length L2 may be obtained. However, because the above calculation is based on ideal assumptions to obtain the value, it may not be consistent with the real situation. After considering the real situation (for example: elastic fatigue, oxidation, wear and tear, stress distribution and other factors), the above critical value is multiplied by a safety factor (which is 10 in this embodiment, but not limited thereto; in other embodiments, the safety factor may be any value greater than 1, such as 5, 8, or 15, depending on the operating environment of the electronic device). In summary, it may be concluded that the first length L1 and the second length L2 satisfy the following equations:

$$10 \times \sqrt{\frac{W}{2k1 \times \tan 1°}} \leq L1 < \frac{P}{2},$$

$$10 \times \sqrt{\frac{W}{2k2 \times \tan 1°}} \leq L2 < \frac{P}{2}.$$

W is the weight of the panel 150 (Newton, N), P is the length of the panel 150 (mm), L1 is the first length (mm), and k1 is the Young's modulus (Megapascal, MPa) of the first side portion 164 (i.e. the first support component 160), L2 is the second length (mm), k2 is the Young's modulus (Megapascal, MPa) of the second side portion 174 (i.e. the second support component 170), and each of k1 and k2 is in a range from 500 to 2500. In the present embodiment, 1 kilogram-weight (kgw) is substantially equal to 9.8 Newtons (N).

Figure 6:
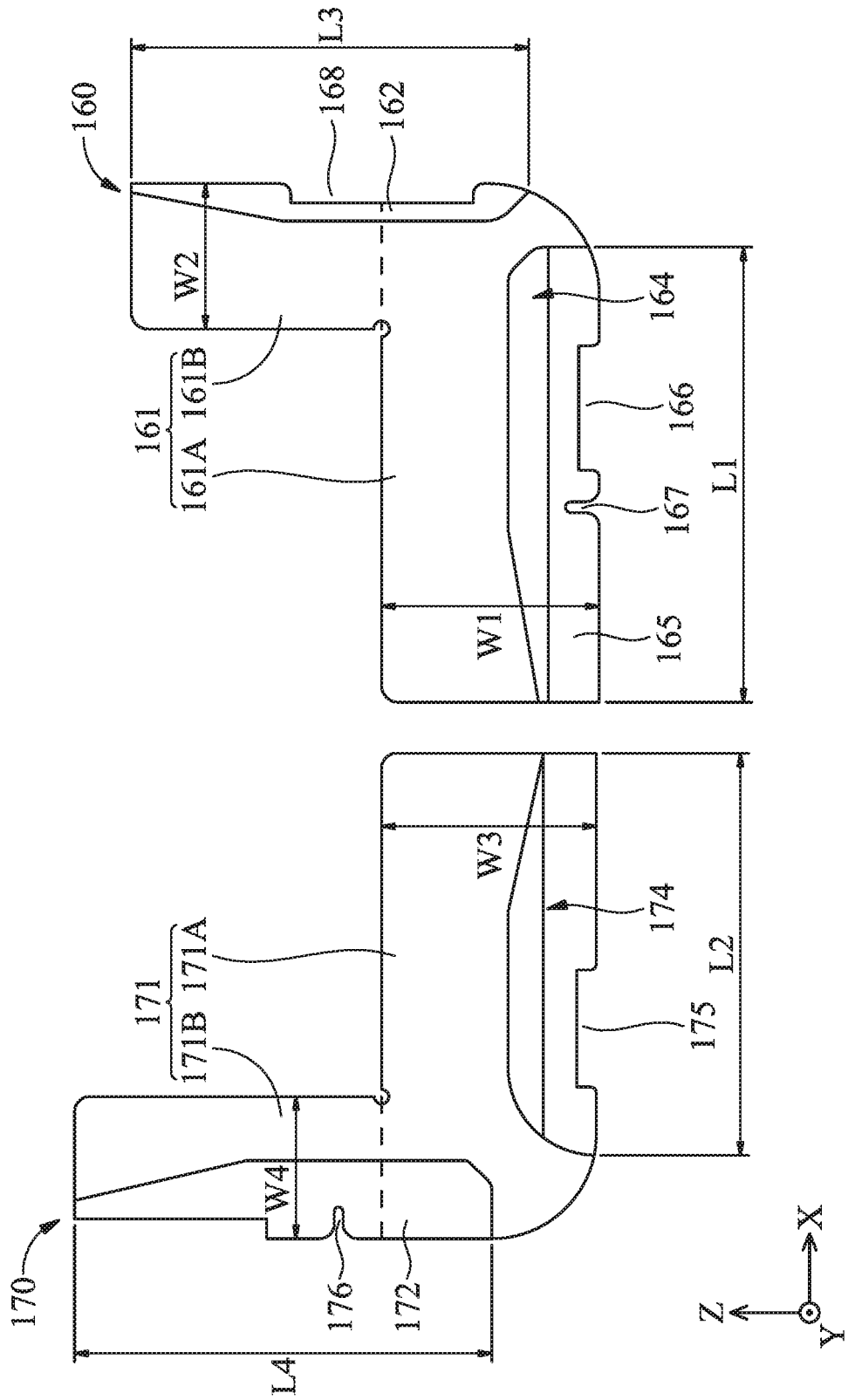
FIG. 6 is a top view illustrating a first support component and a second support component in accordance with some embodiments of the present disclosure.

FIG. 6 is a top view illustrating the first support component 160 and the second support component 170 in accordance with some embodiments of the present disclosure. As shown in FIG. 6, the main portion 161 of the first support component 160 includes a first region 161A and a second region 161B, the first region 161A and the second region 161B extend along a substantially vertical direction (for example, the X direction and the Z direction). Similarly, the main portion 171 of the second support component 170 includes a first region 171A and a second region 171B, the first region 171A and the second region 171B extend in a substantially vertical direction (for example, the X direction and the Z direction). The width W1 of the first region 161A of the main portion 161 may be greater than the width W2 of the second region 161B, wherein the width W1 of the first region 161A is measured along the Z direction, and the width W2 of the second region 161B is measured along the X direction. In some embodiments, the width W1 is the maximum width of the first region 161A, and the width W2 is the maximum width of the second region 161B, but they are not limited thereto.

In addition, a first length L1 of the first side portion 164 may be greater than a third length L3 of the first spacer portion 162, wherein the length of the first side portion 164 is measured along the X direction, and the length of the first spacer portion 162 is measured along the Z direction. In some embodiments, the third length L3 of the first spacer portion 162 is the maximum length of the of the first spacer portion 162, but it is not limited thereto. In the present embodiment, the maximum width of the first side portion 164 is greater than the maximum width of the first spacer portion 162, wherein the maximum width of the first side portion 164 is measured along the Z direction, and the maximum width of the first spacer portion 162 is measured along the X direction. In the above design, the first side portion 164 may provide a better support for the panel 150. Similarly, the second side portion 174 may have a second length L2, the second spacer portion may have a fourth length L4, the first region 171A of the main portion 171 may have a width W3, and the second region 171B of the main portion 171 may have a width W4. In some embodiments, the second length L2 and the fourth length L4 may be the maximum lengths, the width W3 and the width W4 may be the maximum widths, but they are not limited thereto.

Figure 8:
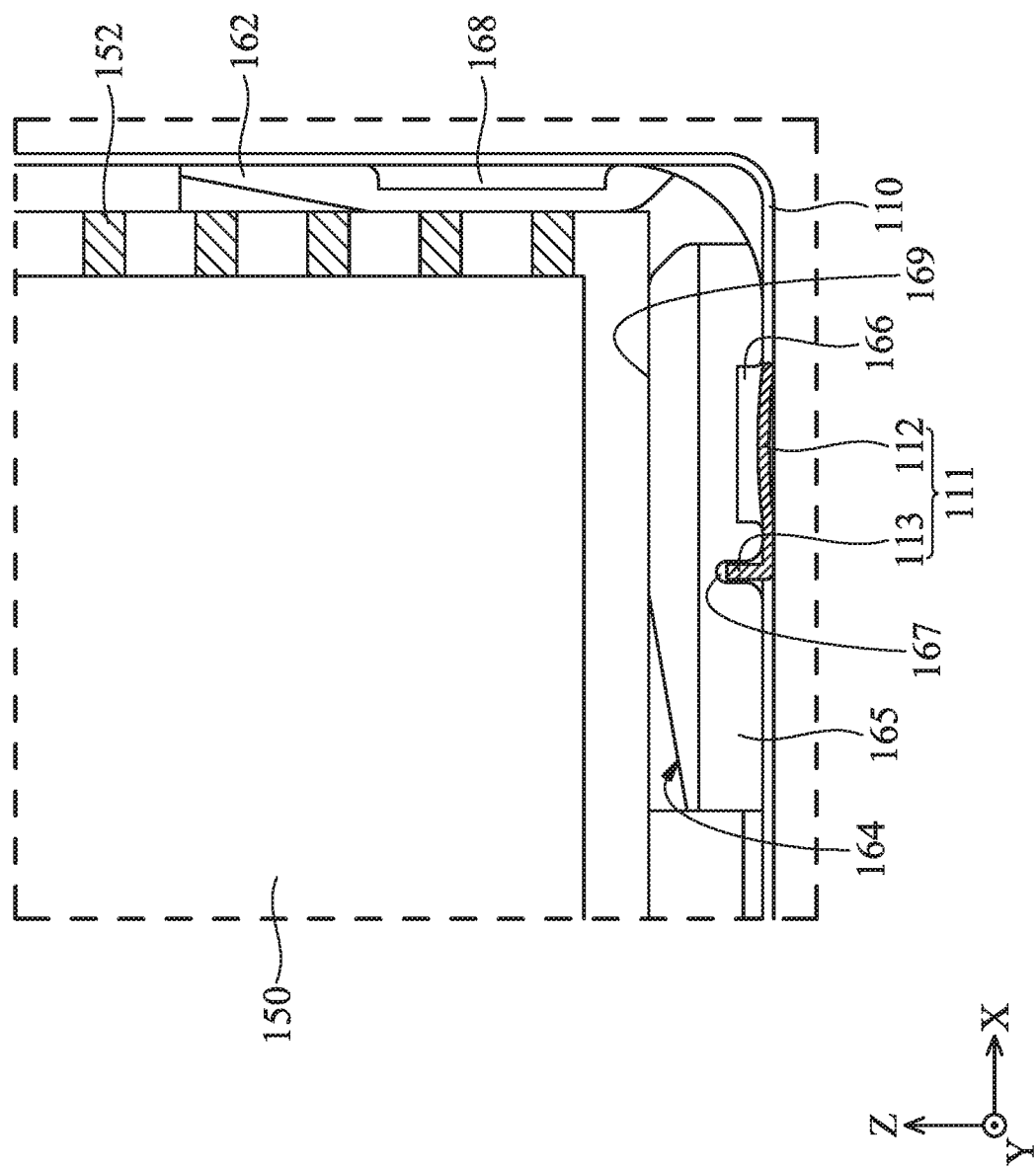
FIG. 8 is an enlarged top view illustrating the electronic device in accordance with some embodiments of the present disclosure.

The first side portion 164 may further include a beveled surface 165, wherein the beveled surface 165 is not parallel to the extending direction of the panel 150 (e.g. the X-Z plane). More specifically, a normal direction of the beveled surface 165 is not parallel to a normal direction of the panel 150 (e.g. the Y direction). In some embodiments, the beveled surface 165 faces the housing 180 (as shown in FIG. 2). As such, a gap may be formed between the housing 180 and the first side portion 164, and the probability of interference between the housing 180 and the first side portion 164 may be reduced. In addition, the first side portion 164 may have a recess 166 and/or a slot 167 that are adjacent to each other, wherein the recess 166 and the slot 167 correspond to an abutting surface 169 (as shown in FIG. 8) between the panel 150 and the first side portion 164. More specifically, when viewed from the Z direction, the abutting surface 169 overlaps with the recess 166 and the slot 167. In the present embodiment, the width of the recess 166 may be greater than the width of the slot 167, wherein the widths of the recess 166 and the slot 167 are measured in the X direction, for example. In some embodiments, the widths of the recess 166 and the slot 167 are the maximum widths thereof. Furthermore, the depth of the recess 166 may be smaller than the depth of the slot 167, wherein the depths of the recess 166 and the slot 167 are measured in the Z direction, for example. In some embodiments, the depths of the recess 166 and the slot 167 may be the maximum depths thereof. In some embodiments, the beveled surface 165 may intersect with the recess 166 and the slot 167. In other words, when viewed in a direction (for example, the Y direction) that is perpendicular to the extending direction of the panel 150, the beveled surface 165 overlaps with the recess 166 and the slot 167. Moreover, in some embodiments, a recess 168 is also disposed in the first spacer portion 162, a recess 175 is disposed in the second side portion 174, and a slot 176 is disposed in the second spacer portion 172 as positioning structures for the assembly of the electronic device 100. It should be understood that the above positions of the recess and the slot only serve as an example, and it is not actually necessary to follow the manner described in the embodiments of the present disclosure. Those skilled in the art may adjust the above structure as required, and it will not be repeated in the following paragraphs.

Figure 7:
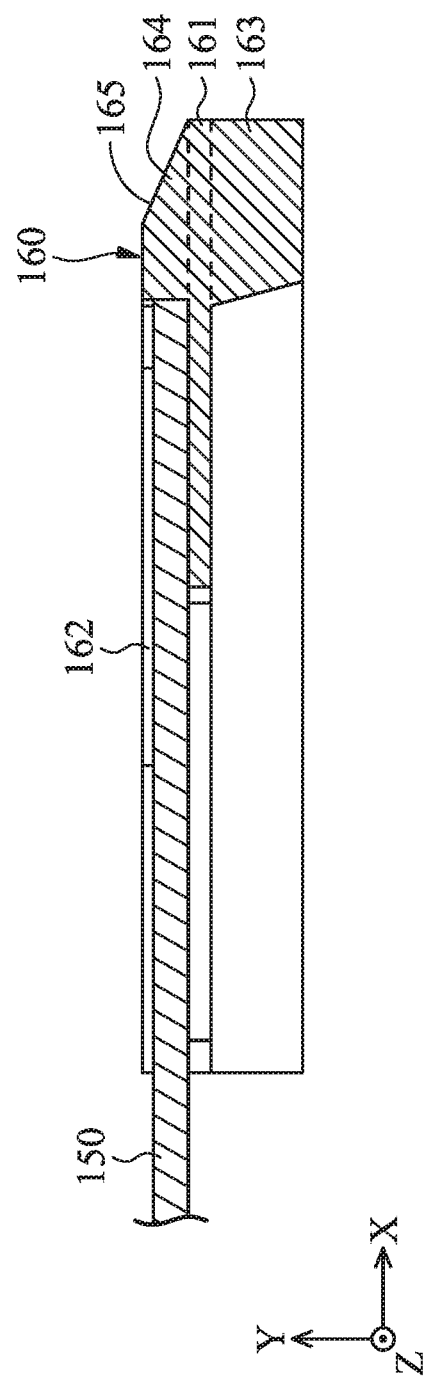
FIG. 7 is a cross-sectional view illustrating the first support component and the panel in accordance with some other embodiments of the present disclosure.

FIG. 7 is a cross-sectional view illustrating the first support component 160 and the panel 150 in accordance with some embodiments of the present disclosure. As shown in FIG. 7, the maximum thickness of the first side portion 164 may be greater than the maximum thickness of the panel 150, but it is not limited thereto. In some embodiments, the thickness of the first side portion 164 may be substantially equal to the thickness of the panel 150. For example, the thickness of the first side portion 164 is in a range from 2.0 mm to 2.5 mm (2.0 mm≤the thickness≤2.5 mm), such as 2.1 mm, 2.2 mm, 2.3 mm, 2.4 mm, etc., but not limited to the values listed above. In some embodiments, the difference between the thickness of the first side portion 164 and the thickness of the panel 150 is in a range from 0.5 mm to 0.8 mm (0.5 mm thickness difference≤0.8 mm), such as 0.6 mm, 0.7 mm, etc., but not limited to the values listed above. In the above design, the probability of collision between the panel 150 and the rigid elements (e.g. the back plate 110, the housing 180, etc.) may be reduced to protect the panel 150. In the present embodiment, the panel 150 may contact the first side portion 164 and the first spacer portion 162, but it is not limited thereto. In the present embodiment, the maximum thickness of the first side portion 164 may be greater than the maximum thickness of the main portion 161, but it is not limited thereto.

FIG. 8 is a partial enlarged top view illustrating the electronic device 100 in accordance with some embodiments of the present disclosure. As shown in FIG. 8, a back plate 110 disposed below the panel 150 and the back plate 110 has a sidewall 111, wherein the sidewall 111 includes a bearing portion 112 and an engaging portion 113, and the bearing portion 112 and the engaging portion 113 extend in different directions. For example, the extending direction (for example, the X direction) of the bearing portion 112 and the extending direction (for example, the Z direction) of the engaging portion 113 are substantially perpendicular, but they are not limited thereto. In the present embodiment, the recess 166 faces the bearing portion 112, and the slot 167 is provided to receive the engaging portion 113. A part of the bearing portion 112 is arc-shaped (having a curvature greater than 0, namely, non-planar), and may protrude toward the recess 166. In some embodiments, the bearing portion 112 does not abut an edge of the recess 166 to provide a buffer space for the first side portion 164, but is not limited thereto. The above design may help to assemble the first support component 160 and the back plate 110, or may increase the support strength of the panel 150.

As set forth above, the embodiments of the present disclosure provide an electronic device including a plurality of support components for supporting the panel. Since the first side portion of the first support component (and/or the second side portion of the second support component) for the supporting panel are disposed to have a specific length, the probability that the users become aware of the panel deformation with naked eye is reduced, and the display performance of electronic devices is maintained. In addition, a recessed structure for assembly positioning may be disposed on the first support component and/or the second support component may facilitate the assembly of the first support component, the second support component, and the back plate, or increase the support strength of the panel.

While the embodiments and the advantages of the present disclosure have been described above, it should be understood that those skilled in the art may make various changes, substitutions, and alterations to the present disclosure without departing from the spirit and scope of the present disclosure. It should be noted that different embodiments in the present disclosure may be arbitrarily combined as other embodiments as long as the combination conforms to the spirit of the present disclosure. In addition, the scope of the present disclosure is not limited to the processes, machines, manufacture, composition, devices, methods and steps in the specific embodiments described in the specification. Those skilled in the art may understand existing or developing processes, machines, manufacture, compositions, devices, methods and steps from some embodiments of the present disclosure. Therefore, the scope of the present disclosure includes the aforementioned processes, machines, manufacture, composition, devices, methods, and steps. Furthermore, each of the appended claims constructs an individual embodiment, and the scope of the present disclosure also includes every combination of the appended claims and embodiments.

What is claimed is:

1. An electronic device, comprising:
a panel comprising a bottom surface, a first corner and a second corner, wherein the bottom surface is connected between the first corner and the second corner;
a first support component comprising a first side portion and a first main portion supporting the first corner of the panel, wherein the first side portion is directly over the first main portion and has a first length and a first Young's modulus; and
a second support component comprising a second side portion and a second main portion supporting the second corner of the panel, wherein the second side portion is directly over the second main portion and has a second length and a second Young's modulus,
wherein the first length and the second length satisfy the following inequalities:

$$10 \times \sqrt{\frac{W}{2k1 \times \tan 1°}} \leq L1 < \frac{P}{2}, \text{ and}$$

$$10 \times \sqrt{\frac{W}{2k2 \times \tan 1°}} \leq L2 < \frac{P}{2},$$

wherein W is a weight (N) of the panel, and P is a length (mm) of the panel, L1 is the first length (mm), k1 is the first Young's modulus (MPa), L2 is the second length (mm), k2 is the second Young's modulus (MPa), and each of k1 and k2 is in a range from 500 to 2500,
wherein the first main portion and the second main portion are in contact with the panel, the first side portion has a recess, a slot adjacent to the recess, and a beveled surface, the recess and the slot correspond to an abutting surface of the first side portion, and the beveled surface intersects with the recess and the slot.

2. The electronic device as claimed in claim 1, wherein the first length is smaller than or equal to a quarter of the length of the panel, and the second length is smaller than or equal to a quarter of the length of the panel.

3. The electronic device as claimed in claim 1, wherein a thickness of the first side portion is greater than or equal to a thickness of the panel.

4. The electronic device as claimed in claim 3, wherein a difference between the thickness of the first side portion and the thickness of the panel is in a range from 0.5 mm to 0.8 mm.

5. The electronic device as claimed in claim 1, wherein the first main portion comprises:
a first region extending from the first corner in a direction, wherein the first side portion is located on the first region; and
a second region extending from the first corner in another direction, wherein a width of the first region is greater than a width of the second region.

6. The electronic device as claimed in claim 5, wherein the first support component further comprises a first spacer portion located on the first main portion, and a length of the first side portion is greater than a length of the first spacer portion.

7. The electronic device as claimed in claim 6, wherein a maximum width of the first side portion is greater than a maximum width of the first spacer portion.

8. The electronic device as claimed in claim 6, wherein the panel contacts the first side portion and the first spacer portion.

9. The electronic device as claimed in claim 5, wherein the panel is disposed on the first main portion.

10. The electronic device as claimed in claim 5, wherein a thickness of the first side portion is greater than a thickness of the first main portion.

11. The electronic device as claimed in claim 1, wherein a width of the recess is greater than a width of the slot.

12. The electronic device as claimed in claim 1, wherein a depth of the recess is smaller than a depth of the slot.

13. The electronic device as claimed in claim 1, further comprising a housing disposed on the first support component, and the beveled surface faces the housing.

14. The electronic device as claimed in claim 1, wherein an extending direction of the beveled surface is not parallel to an extending direction of the panel.

15. The electronic device as claimed in claim 1, further comprising a back plate disposed below the panel, wherein the back plate has a sidewall, the sidewall comprises a bearing portion and an engaging portion, and the bearing portion and the engaging portion extend in different directions.

16. The electronic device as claimed in claim 15, wherein an extending portion of the bearing portion is substantially perpendicular to an extending direction of the engaging portion.

17. The electronic device as claimed in claim 15, wherein the recess faces the bearing portion, and the slot is disposed to accommodate the engaging portion.

18. The electronic device as claimed in claim 15, wherein the bearing portion has a curvature greater than 0, and the bearing portion is convex towards the recess.

\* \* \* \* \*